US009685802B1

(12) United States Patent
Mirov et al.

(10) Patent No.: US 9,685,802 B1
(45) Date of Patent: Jun. 20, 2017

(54) DETECTION OF ACCESSORY PRESENCE AND ORIENTATION

(71) Applicant: Verily Life Sciences LLC, Mountain View, CA (US)

(72) Inventors: Russell Norman Mirov, Los Altos, CA (US); John Lapetina, Los Altos, CA (US)

(73) Assignee: Verily Life Sciences, LLC, Mountain View, CA (US)

( * ) Notice: Subject to any disclaimer, the term of this patent is extended or adjusted under 35 U.S.C. 154(b) by 182 days.

(21) Appl. No.: 14/699,467

(22) Filed: Apr. 29, 2015

(51) Int. Cl.
| | |
|---|---|
| *H01M 10/44* | (2006.01) |
| *H01M 10/46* | (2006.01) |
| *H02J 7/00* | (2006.01) |
| *G01R 33/00* | (2006.01) |
| *G01R 33/06* | (2006.01) |

(52) U.S. Cl.
CPC ........ *H02J 7/0044* (2013.01); *G01R 33/0047* (2013.01); *G01R 33/06* (2013.01)

(58) Field of Classification Search
CPC .......... H02J 7/355; H02J 7/0042; H02J 7/025; H02J 7/0045; H02J 5/005
USPC .................. 320/107, 108, 114, 115; 307/104
See application file for complete search history.

(56) References Cited

U.S. PATENT DOCUMENTS

| | | | |
|---|---|---|---|
| 7,847,515 B2 | 12/2010 | Schroeck et al. | |
| 8,629,653 B2 | 1/2014 | Mochida et al. | |
| 8,954,135 B2 | 2/2015 | Yuen et al. | |
| 2010/0081473 A1* | 4/2010 | Chatterjee | G06F 1/1632 |
| | | | 455/559 |
| 2014/0266939 A1* | 9/2014 | Baringer | H01Q 21/28 |
| | | | 343/729 |

FOREIGN PATENT DOCUMENTS

| | | |
|---|---|---|
| EP | 2750361 | 2/2014 |
| WO | 2014/102450 | 7/2014 |

* cited by examiner

*Primary Examiner* — Edward Tso
(74) *Attorney, Agent, or Firm* — McDonnell, Boehnen, Hulbert & Berghoff LLP

(57) ABSTRACT

Wearable devices configured to detect a magnetic field related to the presence, proximity, relative location, relative orientation, configuration, identity, or other information about an eternal charger or other external device are provided. The wearable devices are configured to detect, using one or more magnetometers, magnetic fields produced by (e.g., by permanent magnets or electromagnets) and/or modified by (e.g., by a shim or other element of magnetic material configured to have a specified high permeability) the external charger. The wearable device can change an operational state, display some information, receive power from the external charger to charge a battery of the wearable device, or perform some other function in response to determining some information about the external charger based on the detected magnetic field.

20 Claims, 7 Drawing Sheets

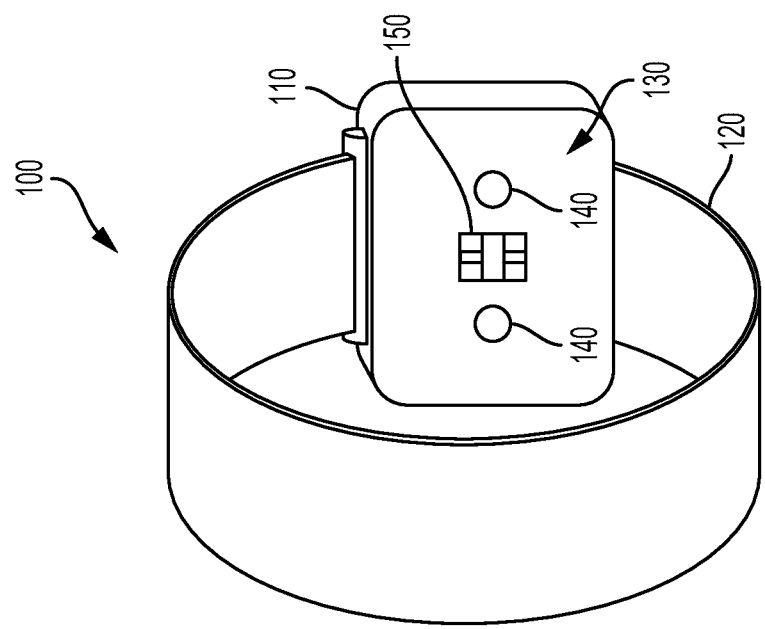
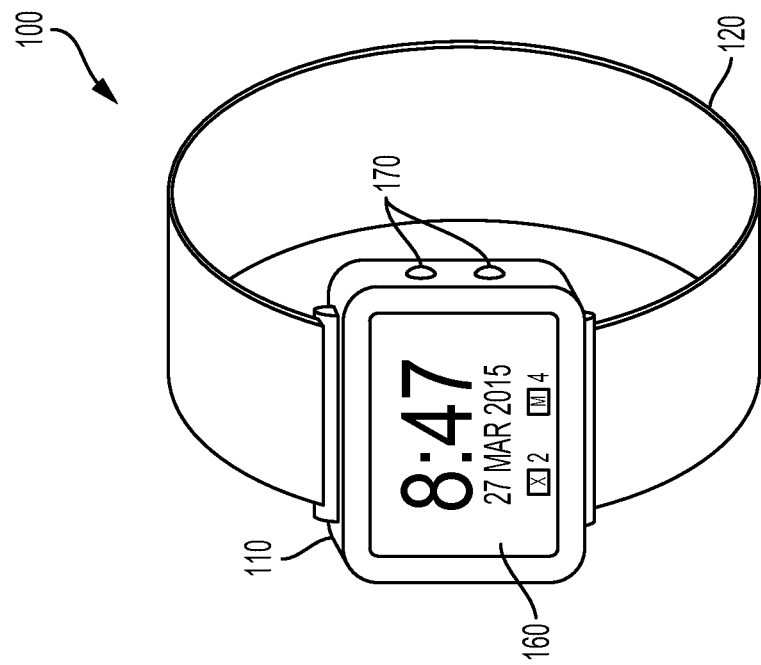

DETECTION OF ACCESSORY PRESENCE AND ORIENTATION

BACKGROUND

Unless otherwise indicated herein, the materials described in this section are not prior art to the claims in this application and are not admitted to be prior art by inclusion in this section.

A variety of applications can be provided by wearable devices, e.g., devices configured to be mounted to a wrist or other location of a user's body. Such devices can provide information and/or communications functions to the user (e.g., by providing an indication of the current time or the user's location, by providing the content of an email received by the user). Such devices could include one or more sensors configured to detect properties of the user's body (e.g., a blood pressure, a heart rate, a blood oxygen saturation) and/or of the environment of the user (e.g., an ambient temperature, a barometric pressure) and to record, provide indications of, communicate (e.g., wirelessly transmit) to external systems, or otherwise use such detected properties. In some examples, such a wearable device can be configured to connect to an external system, e.g., to receive energy from the external system to recharge a battery of the wearable device, to communicate with/via the external system, or to provide some other application of the wearable device.

SUMMARY

Some embodiments of the present disclosure provide a wearable device including: (i) a magnetometer; (ii) at least one electrical contact that is disposed on a surface of the wearable device and that is configured to electrically connect to at least one corresponding electrical contact on an external system; and (iii) a controller that is operably coupled to the magnetometer and that is configured to perform controller operations including: (a) detecting, using the magnetometer, a magnetic field when the wearable device is proximate to the external system; and (b) determining a location of the at least one electrical contact on the wearable device relative to the at least one corresponding electrical contact on the external system based on the detected magnetic field.

Some embodiments of the present disclosure provide a wearable device including: (i) magnetic field sensing means; (ii) electrical contact means disposed on a surface of the wearable device and configured to electrically connect to corresponding electrical contact means on an external system; and (iii) controller means that are operably coupled to the magnetic field sensing means and that are configured to perform controller operations including: (a) detecting, using the magnetic field sensing means, a magnetic field when the wearable device is proximate to the external system; and (b) determining a location of the electrical contact means on the wearable device relative to the electrical contact means on the external system based on the detected magnetic field.

Some embodiments of the present disclosure provide a wearable device including: (i) a magnetometer; (ii) at least one electrical contact that is disposed on a surface of the wearable device and that is configured to electrically connect to at least one corresponding electrical contact on an external system; (iii) an output component; and (iv) a controller, wherein the controller is operably coupled to the magnetometer and the output component, and wherein the controller is configured to perform controller operations including: (a) detecting, using the magnetometer, a magnetic field when the wearable device is proximate to the external system; (b) determining an orientation of the wearable device relative to the external system based on the detected magnetic field; (c) determining a change in the orientation of the wearable device relative to the external system such that the at least one electrical contact on the wearable device could receive power from the external system; and (d) providing, using the output component, an indication related to the determined change in the orientation of the wearable device relative to the external system.

Some embodiments of the present disclosure provide a wearable device including: (i) magnetic field sensing means; (ii) electrical contact means disposed on a surface of the wearable device and that are configured to electrically connect to corresponding electrical contact means on an external system; (iii) output means; and (iv) controller means that are operably coupled to the magnetic field sensing means and the output means and that are configured to perform controller operations including: (a) detecting, using the magnetic field sensing means, a magnetic field when the wearable device is proximate to the external charger; (b) determining an orientation of the wearable device relative to the external system based on the detected magnetic field; (c) determining a change in the orientation of the wearable device relative to the external system such that the electrical contact means on the wearable device could receive power from the external system; and (d) providing, using the output means, an indication related to the determined change in the orientation of the wearable device relative to the external system.

Some embodiments of the present disclosure provide a method including: (i) operating a wearable device that includes: (1) a magnetometer; (2) at least one electrical contact that is disposed on a surface of the wearable device and that is configured to electrically connect to at least one corresponding electrical contact on an external system; and (3) a controller that is operably coupled to the magnetometer; and wherein operating the wearable device includes: (a) detecting, by the controller using the magnetometer, a magnetic field when the wearable device is proximate to the external system; and (b) determining, by the controller, a location of the at least one electrical contact on the wearable device relative to the at least one corresponding electrical contact on the external system based on the detected magnetic field.

These as well as other aspects, advantages, and alternatives, will become apparent to those of ordinary skill in the art by reading the following detailed description, with reference where appropriate to the accompanying drawings.

BRIEF DESCRIPTION OF THE DRAWINGS

FIG. 1A is a front view of an example wearable device.

FIG. 1B is a back view of the example wearable device shown in FIG. 1A.

DETAILED DESCRIPTION

Figure 2A:
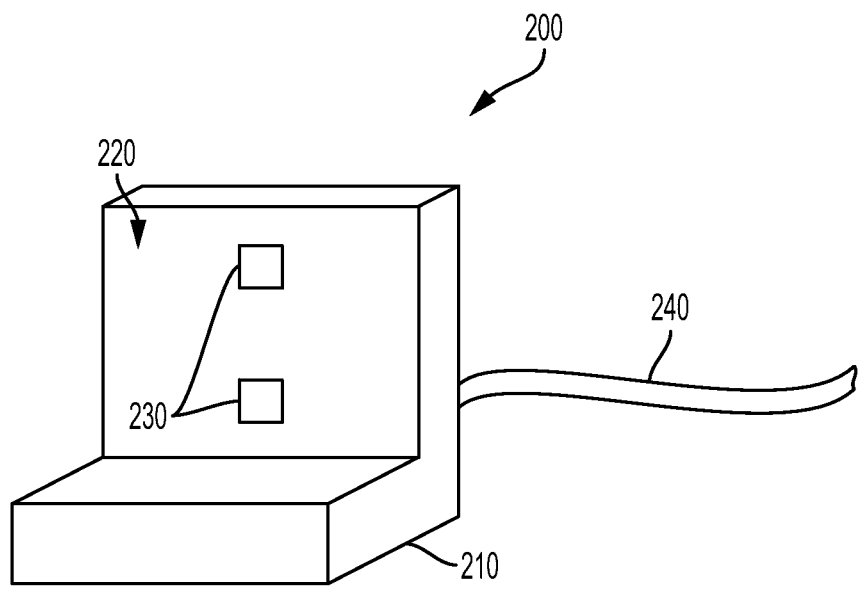
FIG. 2A is an example external charger for a wearable device.

In the following detailed description, reference is made to the accompanying figures, which form a part hereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Further, while embodiments disclosed herein make reference to use of devices and systems configured for use on or in conjunction with a living human body, it is contemplated that the disclosed methods, systems and devices may be used for any devices configured to be electrically coupled to, mounted to, or otherwise brought into contact or proximity with an external charger or other external system or accessory. Properties of a magnetic field proximate such devices can be detected and used to determine a proximity, relative location, relative orientation, or other properties of the relative configuration or relationship between such devices and such external systems. Further, such detected magnetic fields can be used to determine an identity, a type, a configuration, a set of services provided by, a communications or other protocol employed by, a charging current provided by, a location, a locational context, an operational state, or some other information about the configuration and/or operation of such external systems.

I. OVERVIEW

A wearable device may be configured to perform a variety of different functions and/or applications. In some examples, a wearable device is configured to measure one or more physiological parameters of a wearer and/or to measure one or more properties of the environment of the wearer. Additionally or alternatively, the wearable device could include a user interface configured to present information to a user and/or to receive inputs from the user. Such wearable devices could be configured to removably couple to external systems (e.g., external chargers, docking stations, cradles) to provide a variety of applications. For example, an external charger or other external system could provide power (e.g., power to recharge a battery of a wearable device), communications (e.g., a communications channel to download updated software, to upload recorded information, to sync with a user account, to sync with a data backup service, to interact with a vehicle), access to one or more peripherals (e.g., sensors, user interface elements, or some other facilities) to the wearable device. The external system could provide such facilities by including one or more electrical contacts configured to electrically connect to corresponding one or more electrical contacts of the wearable device, by including a coil or other antenna configured to provide power to and/or communicate with a corresponding antenna of the wearable device, or through some other means.

A wearable device could include a magnetometer configured to detect a magnetic field that is related to one or more properties of an external charger that is proximate to the wearable device and/or related to a relationship between the wearable device and the external charger (e.g., related to a relative location and/or orientation of the wearable device and the external charger and/or components thereof). Such a magnetometer could be configured to detect a magnitude, direction, frequency, frequency spectrum, waveform, polarization, or other properties of a magnetic field such that the relative location, relative orientation, configuration, identity, status, or other information about the external charger could be determined based on the detected magnetic field. For example, a location of at least one electrical contact of the wearable device relative to at least one corresponding electrical contact of an external charger could be determined based on the detected magnetic field. The magnetometers could include one or more Hall Effect sensors, magnetoresistive sensors, magnetoimpedance sensors, micro-electromechanical magnetometers, or other components sensitive to magnetic fields in one or more directions.

Information about an external charger determined based on a detected magnetic field could be used to determine some information about the coupling and/or mounting of the wearable device to the external charger, about the function of the external charger, and/or some other information. For example, information about the proximity, location, and/or orientation of the device relative to the external charger (e.g., the location of at least one electrical contact of the wearable device relative to at least one corresponding electrical contact of the external charger) could be used to determine whether the wearable device could receive power from or otherwise electrically interact with the external charger. In a particular example, the determination that an electrical contact of the wearable device is in electrical contact with a corresponding electrical contact of the external charger could, in combination with the determination that the wearable device is not receiving power from the external charger via the electrical contact, be used to determine that the external charger is unplugged or otherwise disabled. Additionally or alternatively, such a determination could be used to responsively send a command to the external charger (e.g., wirelessly, using an antenna) to begin providing power. In another example, it could be determined that the wearable device is incorrectly mounted or otherwise coupled to the external charger (e.g., is mounted to the external charger upside-down or otherwise rotated relative to a correct orientation for mounting). Information related to such a determination and/or a determined rotation or other manipulation of the wearable device to properly mount the wearable device to the external charger could be provided to a user (e.g., via an indication produced by a display or other output component of the wearable device).

Detected magnetic fields could also be used to detect an identity, configuration, status, location, or some other information about an external charger. For example, a type of the external charger, a set of facilities or features provided by the external charger, an amount of power (e.g., a maximum current) provided by the external charger, or some other information about the external charger could be determined from the detected magnetic field. In some examples, such determined information could be used to control or adjust an operational mode or status of the wearable device. For example, a method for recharging a rechargeable battery of the wearable device (e.g., trickle charge, fast charge) could be selected based on a determined amount of power provided by the external charger that is determined based on a detected magnetic field.

In some examples, a type of information and/or alerts presented by the wearable device (e.g., via a display, speaker, beeper, or other output component of the wearable device) and/or an operational mode of the wearable device could be selected and/or controlled based on determined information about the external charger. For example, when the wearable device determines that a proximate external charger is a first external charger (e.g., an external charger associated with a user's bedroom), audio alerts generated and/or received by the wearable device could be muted, a brightness of a display of the wearable device could be reduced, and the wearable device could communicate with a remote server, through the external charger, to upload recorded physiological parameter data. When the wearable device determines that a proximate external charger is a second external charger (e.g., an external charger associated with a user's office), the wearable device could present audio alerts and/or display the contents of emails received by the user, display the current time, provide an indication of the user's schedule, or operate in some other way. Other methods of operation of the wearable device based on detected magnetic fields (e.g., based on identity, proximity, relative location, or other properties of a proximate external charger or other external device determined based on detected magnetic fields) are anticipated.

A magnetic field detected by a magnetometer of a wearable device could be related to one or more properties of a proximate external charger or other external device in a number of ways. In some examples, the external charger could include one or more permanent magnets, electromagnets, current-carrying conductors, or other elements configured to produce, in whole or in part, the magnetic field detected by the magnetometer such that the proximity, relative location, relative orientation, identity, or other information about the external charger can be determined based on the magnitude, direction, or other properties of the magnetic field detected by the magnetometer. For example, a first external charger could include a permanent magnet that has a dipole moment oriented in a first direction relative to the wearable device when the wearable device is mounted to the first external charger and a second external charger could include a permanent magnet that has a dipole moment oriented in a second direction relative to the wearable device when the wearable device is mounted to the second external charger. Additionally or alternatively, an external charger could include one or more magnetic shims or other magnetic materials configured to affect a magnetic field produced by the wearable device, the earth's magnetic field, or some other magnetic field such that the magnetic field detected by the magnetometer is related to a property of the external charger when the wearable device is proximate. Further, the magnetometer could be configured to detect a magnetic field at more than one location (e.g., the magnetometer could include multiple magnetically-sensitive elements configured to detect magnetic fields at respective more than one locations on or within the wearable device).

In some examples, the wearable device may include a user interface that is configured to provide user-discernible indications (e.g., visual, audible, and/or tactile indications) of information sensed by sensors of the wearable device, progress or other information related to a function of the device, or other information. In some examples, the user interface could additionally provide a means for one or more settings of the wearable device (e.g., a sampling rate, a user information privacy setting, a user's credentials to access a service) to be specified by a wearer according to the wearer's preferences. Indications provided by an output component (e.g., a display, a beeper, a vibrator, a speaker) could indicate information related to a detected magnetic field, e.g., indications that the wearable device is incorrectly mounted to an external charger, indications that an external charger is inoperable, indications related to a location of the external charger (e.g., darkening a screen when a charger associated with a user's bedroom is identified, providing audio alerts related to emails received by a user when a charger associated with a user's office is identified). In some examples, the wearable device may include a wireless communication interface that can transmit/receive data to/from an external device, for example, using Bluetooth, ZigBee, WiFi, NFC, and/or some other wireless communication protocol. The wireless communications interface could additionally or alternatively be configured to receive data from an external system.

The wearable device could include a mount (e.g., a strap, a belt, an enclosing member, an adhesive) configured to secure the wearable device to a wrist, neck, abdomen, ankle, or some other location of a user's body. Additionally or alternatively, embodiments described herein could be configured as other types of devices, e.g., handheld devices, benchtop devices, or otherwise configured devices that include magnetometers that can be used to detect magnetic fields related to a relative location, relative orientation, identity, status, or other properties of an external device (e.g., an external charger) when the device is proximate to the external device. It should be understood that the above embodiments, and other embodiments described herein, are provided for explanatory purposes, and are not intended to be limiting.

Note that the description of devices herein as interacting with and/or detecting properties of external chargers is intended as a non-limiting example of devices interacting with external devices. Such external devices could include chargers, docking stations, cradles, or other external devices that could be configured to provide power to a device, to provide communications to a device, to provide access to one or more peripherals, or to provide some other facilities and/or functions related to the device.

II. EXAMPLE DETECTION OF MAGNETIC FIELDS BY A WEARABLE DEVICE

A wearable device can be any device configured to be mounted to a body and to provide some functions of the wearable device. Such a device could include a mount, a strap, adhesives, could be incorporated into a garment, or include other means or be otherwise configured to be mounted to a body, e.g., to a skin surface of a body. For example, a wearable device could be configured to be mounted to a wrist of a body. A wearable device could include sensors configured to detect and/or determine one or more properties of a body to which it is mounted (e.g., a health state, a heart rate, a blood oxygen saturation, the presence and/or concentration of an analyte in the body, a Galvanic skin resistance) and/or of the environment of the wearable device (e.g., an ambient temperature, an ambient light level, a barometric pressure). Additionally or alternatively, a wearable device could include a user interface and/or communications means (e.g., a Bluetooth radio, a WiFi radio) configured to indicate information to a user and/or to receive inputs from a user, to communicate information with an external system, or to provide other functions. For example, a communications interface of the wearable device could be configured to receive notifications from an external system (e.g., a cellphone) and to indicate those notifications using a display. Such a display could additionally be used to provide indications of information (e.g., pulse rates, blood oxygen saturations) detected using sensors of the wearable device.

A wearable device could be configured to communicate with, receive power from, control the operation of, or otherwise interact with an external charger or other external system. In some examples, this could include the wearable device being mounted to or otherwise located in proximity to the external charger, e.g., such that one or more electrical contacts located on the surface of the wearable device are electrically connected to corresponding electrical contacts of the external charger. In such examples, the wearable device could be configured to detect the relative location, relative orientation, identity, configuration, function provided by, operational status or mode, or other properties of the external charger and to operate based on such detection.

In some examples, this could include using a magnetometer of the wearable device to detect a magnetic field that is related to (e.g., produced by, modified by) the external charger. For example, the external charger could include one or more permanent magnets and/or electromagnets, and the magnetometer could detect a magnetic field produced by the one or more permanent magnets and/or electromagnets to allow determination that the wearable device is mounted to the external charger and/or to determine a location of one or more elements (e.g., electrical contacts) of the wearable device relative to one or more elements (e.g., corresponding electrical contacts) of the external charger. This could further include determining whether the wearable device is correctly mounted to the external charger, e.g., by determining that the location of an electrical contact of the wearable device is less than or approximately equal to some specified distance from a corresponding electrical contact of the external charger. Such a magnetometer could additionally or alternatively be used to detect other magnetic fields, e.g., to detect a magnetic field produced by the Earth.

As an example, FIG. 1A shows a first view of a wearable device 100 that includes a mount 120 (i.e., a strap) configured to mount a housing 110 of the device 100 proximate to an external body surface of a person (e.g., a wrist surface of an arm). A user interface of the device 100 includes a display 160 configured to provide indications to a wearer (e.g., to provide the time and date, and to provide indications of the number of text messages and emails received by the user) and buttons 170 configured to receive inputs from the user. FIG. 1B shows a second view of the device 100, illustrating the reverse side of the housing 110 including a mounting surface 130 of the housing 110. Two electrical contacts 140 are disposed on the mounting surface 130 and are configured to electrically connect with corresponding electrical contacts of another device (e.g., corresponding electrical contacts of an external charger) to provide functions of the device 100 (e.g., to communicate with the external system, to receive energy from the external system, and/or to detect a property, e.g., a Galvanic skin resistance, of skin to which the electrical contacts 140 are exposed). The device 100 additionally includes a biosensor 150 disposed on the mounting surface 130 and configured to detect one or more physiological properties (e.g., a blood flow rate and/or blood oxygenation of blood in a portion of subsurface vasculature) of a wearer when the device 100 is mounted to the body of the wearer.

Note that the configuration of the device 100 (e.g., the location of electrical contacts 140 and sensor 150 on a mounting surface 130 of a housing 110 opposite a display 160) is intended as an illustrative example of the systems and methods described herein. A wearable device or other system(s) configured to detect a magnetic field related to one or more properties of an external charger or other external system could be differently configured and/or could include more or fewer of the illustrated elements. For example, the device 100 could include a coil or other antenna configured to communicate with and/or receive energy from an external charger additionally or alternatively to using the electrical contacts 140. Further, the device 100 could include adhesives, hooks, catches, molded or otherwise formed surfaces or features (e.g., grooves, registration bumps, or other features formed in the mounting surface 130), magnets, electroadhesive elements, or other components to enable to the housing 110 or other elements of the device 100 to be mounted to, engaged in electrical contact with, or otherwise disposed proximate to one or more components of an external charger or other external system(s).

Further, embodiments of systems and methods described herein could include multiple housings, mounts or other elements configured to mount electrical contacts, sensors, or other components proximate external body surfaces or other locations or tissues of a body of a person and/or to mount such components proximate to and/or in electrical contact with elements of external charger or other external devices or systems. Such multiple mounts, housings, or other elements could be connected via wires, cables, tethers, hinges, or other elements according to an application and/or could be in wireless communication to enable some applications. Additionally or alternatively, electrical contacts, sensors, or other components could be disposed as part of handheld, desktop, or other device(s) configured to detect a magnetic field, to determine one or more properties (e.g., a relative location and/or orientation) of an external charger or other external system based on the detected magnetic field, and/or to operate and/or interact with the external charger based on the determined property of the external charger.

The disposition of sensors, electrical contacts, user interface elements (e.g., displays, buttons, touch-sensitive elements), or other components of a wearable device could be specified to allow sensors to access portions of the body, could permit the user to comfortably provide inputs to the device, could permit the user to see a display or otherwise receive an indication provided by the device, or to provide some other application according to some considerations. For example, the wearable device could be configured to be mounted to a wrist of a wearer. A display and/or other elements of a user interface of such a device could be disposed on/within the device such that the wearer can easily view the display and/or interact with the user interface when the device is mounted to the user's wrist. Further, sensors of the wearable device could be disposed on/within the device such that the sensor could detect properties of blood or other contents of subsurface vasculature within the user's wrist when the device is mounted to the user's wrist.

Sensors (e.g., 150) included in embodiments of systems or methods described herein could include a variety of types of sensors configured in a variety of ways to detect a variety of different physiological and/or environmental properties according to an application. Sensors could be configured to be in electrical, thermal, mechanical, fluidic, chemical, or some other form of contact or access with tissues of a body. This could include a sensor having one or more electrodes or probes having a specified electrical, thermal, or other resistance and configured to allow a flow of heat energy, electrical current, or some other energy through the electrodes or probes. In some examples, a sensor could include two or more electrodes configured to allow a voltage between two or more respective portions of tissue in contact with the electrodes to be measured, to allow a current through the two or more electrodes to be measured, to allow a current and/or voltage to be provided to the portions of tissue, or to allow some other electrical interaction with tissue. In some examples, one or more electrical contacts (e.g., 140) of the device that are configured to electrically connect with electrical contacts of an external charger (or other external device) could form part of a sensor that is configured to provide one or more electrocardiographic, tissue impedance, Galvanic skin potential, Galvanic skin resistance, or other electrical properties of a body to be detected when the device is mounted to the body.

Sensors could be configured to emit energy toward/into portions of tissue (e.g., portions of subsurface vasculature) and/or to receive energy emitted from portions of tissue to allow detection of hemodynamic or other properties of a body. Sensors could be configured to emit and/or receive light (e.g., visible, infrared, or ultraviolet light), electromagnetic radiation, acoustical vibrations (e.g., pulses of ultrasound), electrical fields, magnetic fields, or some other directed energy or energy field(s). In such examples, one or more properties or features of an excitation spectrum, an abruption spectrum, an emission spectrum, a scattering spectrum, or some other optical property of tissues (e.g., of blood within a portion of subsurface vasculature) or of some other environment of interest could be detected.

Wearable devices or other systems or devices as described herein (e.g., 100) could be configured to be mounted to or otherwise placed in proximity to external systems (e.g., external chargers) to provide some functions, e.g., communications between the devices and external systems, power transfer between the devices and external systems, and/or mass transfer (e.g., the transfer of tissue and/or fluid samples accessed and stored by a wearable device) between the devices and external systems. This could include the wearable device being configured to mount to an external charger such that a coil of the wearable device can communicate with and/or receive power from an external charger (e.g., as part of an RFID communications and/or powering protocol). Additionally or alternatively, the wearable device could be configured to mount to an external charger such that one or more electrical contacts of the wearable device can electrically connect with (e.g., can be maintained in contact with and/or have a force pressed against) corresponding electrical contacts of an external charger.

As an illustrative example, FIG. 2A shows an external charger 200 that includes a housing 210 and a cord 240. The housing 210 includes a device mounting surface 220 to which a wearable device (e.g., 100) could be mounted and/or proximate to which a wearable device could be disposed to enable some function or application. Two electrical contacts 230 are disposed on the device mounting surface 220 and are configured to electrically connect to corresponding electrical contacts of a device (e.g., the electrical contacts 140 of the wearable device 100) when the device is mounted to the external charger 200. The cord 240 could be configured to connect to a communications interface (e.g., an Ethernet hub or switch), a power source (e.g., mains power of a building, a powered Ethernet hub or switch), or to some other system(s) to provide communications, power, or some other resource to provide a function of the external charger 200 and/or of a device configured to operate in combination with the external charger 200.

Figure 2B:
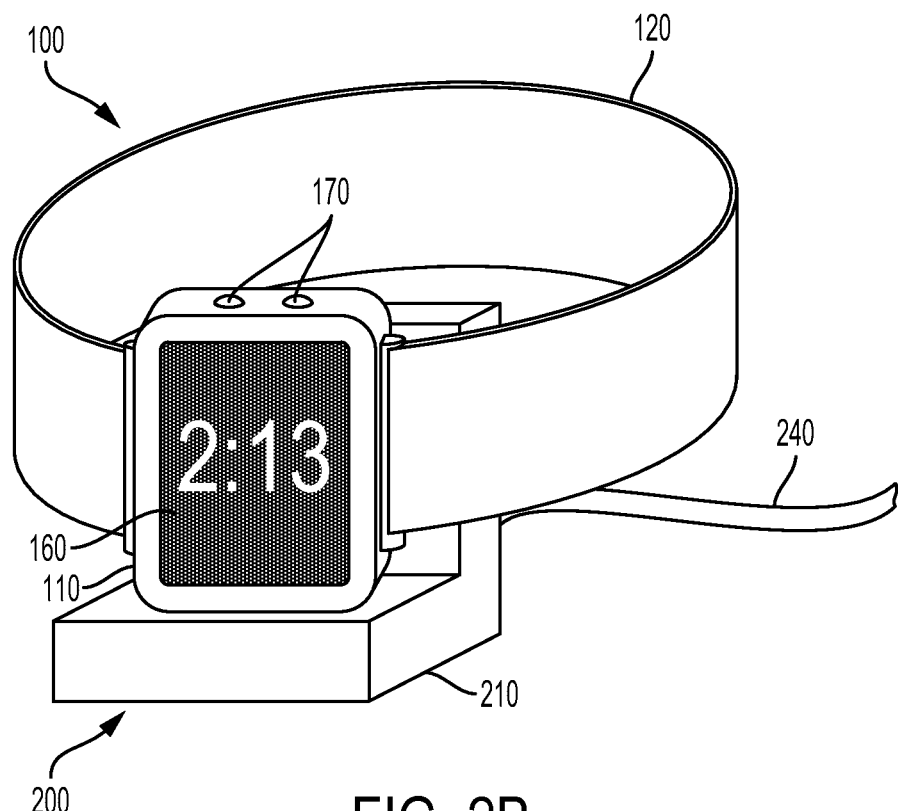
FIG. 2B shows the wearable device shown in FIGS. 1A and 1B mounted to the external charger shown in FIG. 2A.

To illustrate this, FIG. 2B shows the wearable device 100 mounted to the external charger 200 such that the wearable device electrical contacts 140 are electrically connecting to the external charger electrical contacts (i.e., such that the device mounting surface 130 is mounted to, engaged with, magnetically attracted to, in contact with, or otherwise proximate to the external charger mounting surface 220. The display 160 of the wearable device 100 is operated to provide indications related to the wearable device 100 being mounted to and/or proximate to the external charger 200 and/or related to a property of the external charger 200 (e.g., that the external charger is located in a bedroom or other specified location). As shown in FIG. 1B, this includes the display 160 being operated to have a dark background and to only indicate the time, e.g., to reduce a total amount of illumination produced by the display 160.

As shown in FIGS. 1B and 2A, the mounting surfaces of the wearable device 100 and the external charger 200 (130 and 220, respectively) are substantially flat surfaces. However, surfaces or other aspects of wearable devices, external chargers, external docking stations, or other systems, devices, or embodiments as described herein could include additional elements, formed shapes, ridges, registration bumps, protrusions, or other formed features, or other aspects configured to provide for the removable mounting of a wearable or other device to an external charger or other external system such that the devices can communicate, transfer power, or provide some other function. For example, mounting surfaces could include corresponding snaps, hooks, latches, guide pins, grooves, ridges, other guide features, or other elements or formed aspects/shapes to provide support for a wearable device mounted to an external charger, to guide mounting of the wearable device to the external charger at the correct location and/or in the correct orientation relative to the external charger (e.g., such that corresponding electrical contacts of the wearable device and the external charger are electrically connected).

Further, one or more magnets, electromagnets, magnetic shims, or other magnetic materials and/or magnetic flux sources could be provided in the wearable device and/or the external charger to apply an attractive or other magnetic force to align a wearable device with an external charger, to apply an attractive force to maintain the wearable device proximate to the external charger and/or to maintain electrical contacts of the wearable device in electrical connection with corresponding electrical contacts of the external charger, or to provide some other function. For example, a magnetometer of the wearable device could detect a magnetic field produced and/or modified by such magnetic elements of an external charger to determine a property of the external charger (e.g., the identity of the charger, a facility or function provided by the external charger) and/or a relationship between the external charger and the wearable device (e.g., that the wearable device is incorrectly mounted to the external charger, that the wearable device is correctly mounted to the external charger, that an electrical contact of the wearable device is proximate to a corresponding electrical contact of the external charger).

Figure 3:
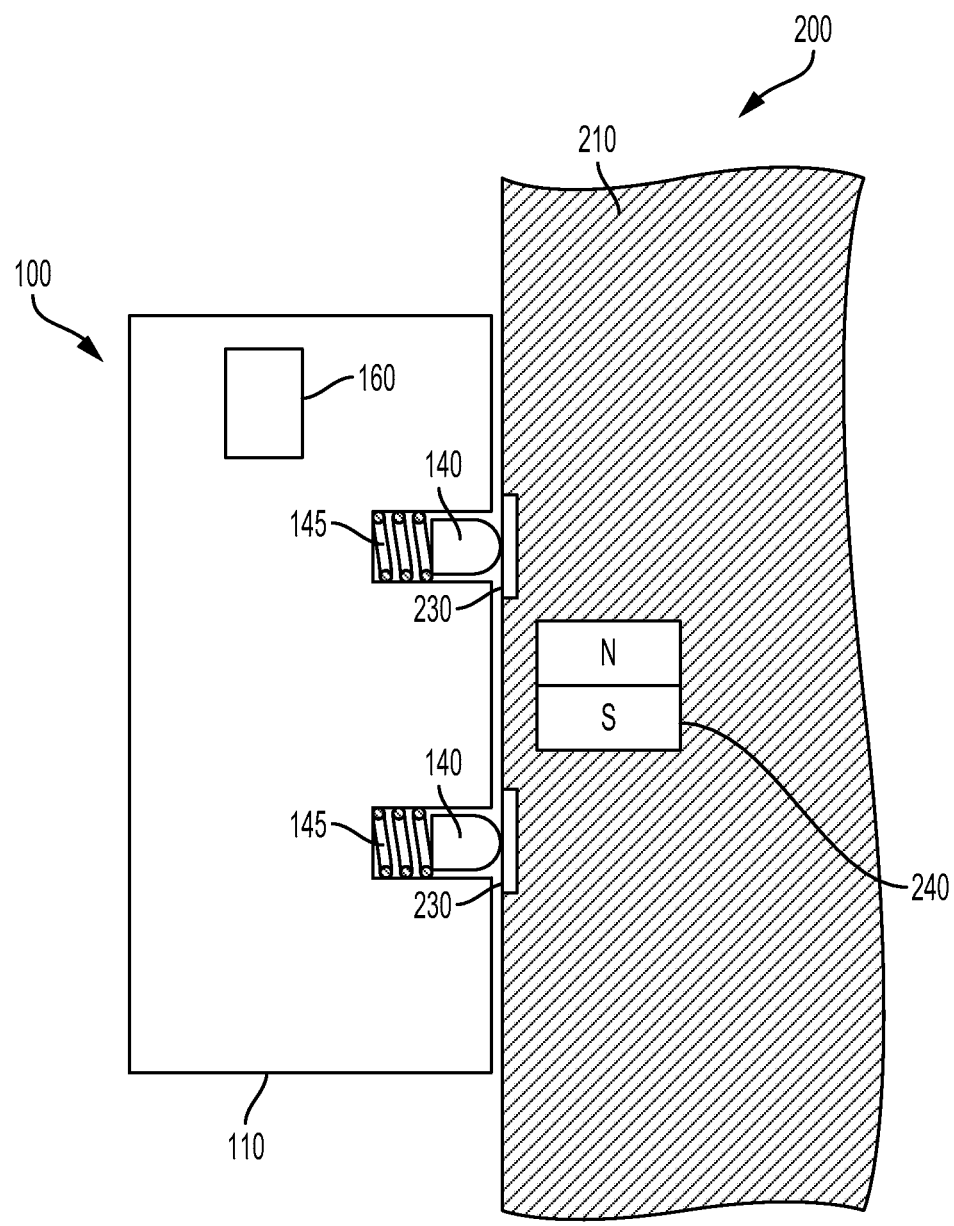
FIG. 3 is a cross-sectional view of elements of the wearable device shown in FIGS. 1A, 1B, and 2B and of the external charger shown in FIGS. 2A and 2B when the wearable device is mounted to the external charger.

To illustrate the mounting and/or location of a wearable (or otherwise configured) device proximate to corresponding elements of an external charger (or other external device), FIG. 3 shows a cross-sectional view of elements of the wearable device 100 and the external charger 200 when the wearable device 100 is mounted to the external charger 200. A magnetic flux source 240 (e.g., a dipolar permanent magnet, as shown) is located within the housing 210 of the external charger 200 and configured to exert an attractive magnetic force on the wearable device 100 (e.g., on a permanent magnet, electromagnet, magnetic shim, high-permeability magnetic material, or other magnetic element(s) in the wearable device 100) such that the wearable device electrical contacts 140 are maintained in contact with corresponding external charger electrical contacts 230. As illustrated, this includes exerting sufficient force to partially compress springs 145 of the wearable device 100. Further, a magnetometer 160 of the wearable device 100 is configured to detect a magnetic field that is produced by the magnetic flux source 240 and/or that is otherwise related to the presence, configuration, or other properties of the external charger 200 when the wearable device 100 is proximate the external charger 200.

As illustrated in FIG. 3, the external charger 200 includes a magnetic flux source 240 configured to exert an attractive magnetic force on the wearable device 100 when the wearable device 100 is proximate the external charger 200. Additionally or alternatively, the wearable device 100 could include one or more magnetic flux sources (e.g., permanent magnets, electromagnets, magnetizable materials) configured to exert an attractive magnetic force on elements of the external charger 200 (e.g., permanent magnets, magnetic shims, other magnetic materials) to maintain the wearable device 100 in contact with the external charger 200 (e.g., to maintain corresponding electrical contacts 140, 230 of the devices 100, 200 in electrical contact with each other), to align the wearable device 100 with the external charger 200, or to provide some other application of a magnetic force exerted between a two devices. In some examples, magnetic elements (e.g., permanent magnets, electromagnets, magnetic shims, high-permeability materials) of the wearable device 100 and/or the external charger 200 could be configured to produce a magnetic field and/or to modify a magnetic field (e.g., by changing a magnetic field by shunting flux of the magnetic field through a shim composed of a low-reluctance magnetic material) in such a say that the magnetometer 160 could detect a property (e.g., a direction, a magnitude, a frequency) of such a produced and/or modified magnetic field such that a property of the external charger 200 and/or a property of the relationship between the external charger 200 and the wearable device 100 (e.g., a relative location, a relative orientation, that an electrical contact of the wearable device is electrically connected to and/or less than or approximately equal to a specified distance from a corresponding electrical contact of the external charger) could be determined based on the detected magnetic field.

The magnetometer 160 could be configured to detect the direction, magnitude, frequency, frequency spectrum, waveform, or other properties of a magnetic field at one or more points on or within the magnetometer 160. For example, the magnetometer 160 could detect the magnitude of a magnetic field in a number of different directions at a specified location within the magnetometer 160. The three or more different directions could be three orthogonal directions such that the magnitude and direction of the magnetic field at the specified location could be determined based on the corresponding three detected magnitudes of the magnetic field in respective orthogonal directions. The magnetometer could additionally be configured to detect a gradient of the magnetic field and/or to detect the magnitude or other properties of the magnetic field at two or more different locations such that the gradient of the magnetic field can be determined based on the detected properties of the magnetic field at the two or more different locations.

The magnetometer could include one or more Hall Effect sensors, magnetoresistance sensors, giant magnetoresistance sensors, magnetoimpedance sensors (e.g., wire magnetoimpedance sensors), inductive pickup coils, fluxgate magnetometers, spin-exchange relaxation-free magnetometers, or other magnetically sensitive components or elements. Each component of a magnetometer could be configured to detect an overall magnitude of a magnetic field, a magnitude of a magnetic field in a specified direction, a direction of a magnetic field, a magnitude of a magnetic field perpendicular to a specified direction, or some other property of a magnetic field. A magnetometer could be operated to detect one or more properties of a magnetic field at one or more points in time, to produce an output that is related to an integral, derivative, or otherwise filtered version of a property of the magnetic field over time, or to generate some other output that is related to one or more properties of the magnetic field at one or more points in time and/or over one or more specified periods of time. For example, the magnetometer 160 could be configured to output a signal related to the magnitude and/or power of a time-varying magnetic field within a specified range of frequencies. In some examples, the magnetometer 160 could be configured to detect a magnetic field produced by the Earth, e.g., to produce navigational information related to the location and/or orientation of the wearable device 100 when the wearable device 100 is not proximate to the external charger 200.

In some examples, the location and/or orientation of a wearable device (e.g., 100) and/or components thereof (e.g., one or more electrical contacts) relative to an external charger or other external system (e.g., 200) and/or components thereof (e.g., an electrical contact of the external charger that corresponds to an electrical contact of the wearable device) could be determined based on one or more properties of a magnetic field detected by a magnetometer of the wearable device. For example, the magnitude and/or direction of the magnetic field detected by the magnetometer could be used to determine the location of the wearable device relative to the external charger. This could include determining the location of the wearable device relative to the external charger cased on information about a magnetic field produced by the external charger. For example, the information about the external charger could include information about a magnitude of a magnetic dipole of a permanent magnet of the external charger and an orientation and location of the magnetic dipole of a permanent magnet on or within the external charger. Based on this information, a wearable device could determine the location, or a range and/or set of possible locations, of the external charger relative to the wearable device.

For example, the wearable device could determine, based on a detected direction and magnitude of a magnetic field produced by the external charger, that the location and orientation of the wearable device relative to the external charger was a location and orientation of a range of locations and orientations, e.g., that the wearable device was one of a range of distances from the external charger based on a detected magnitude of the magnetic field. In some examples, the external charger could be shaped such that a detected direction and/or magnitude of detected magnetic fields correspond to a specified range and/or set of locations and/or orientations of the wearable device relative to the external device. For example, a permanent magnet of the external charger that is configured to produce a magnetic field that is detectable by the wearable device could be disposed near an external mounting surface of the external charger. In such examples, a detected magnitude of the magnetic field detected by the wearable device above a specified magnitude could indicate that the wearable device is proximate the mounting surface. The information about the external charger could include information about such geometry of the external charger. Additionally or alternatively, the information about the external charger could include lookup tables, specified maximum or minimum detected field magnitudes and/or directions, or other information relating properties of detected magnetic fields to specified ranges and/or set of locations and/or orientations of the wearable device relative to the external charger.

Further, the wearable device could have access to (e.g., could include an on-board memory that includes such information, could be in communication with an external system that has access to such information) information about multiple external chargers or other external systems such that the wearable device could determine a location and/or orientation of the wearable device relative to more than one external charger. Such information could additionally be used to determine the identity of such external chargers. For example, two or more external chargers could include similar mounting surfaces proximate to which respective permanent magnets are disposed. The dipole moments of the permanent magnets could have respective different magnitudes and/or orientations or locations relative to the external chargers such that a wearable device could determine the identity of a charger to which the wearable device is proximate. In some examples, a wearable device identifying an external charger based on a detected magnetic field could include comparing one or more properties of the detected magnetic field (e.g., a detected magnitude, a detected direction) with a set of specified properties (e.g., a set of specified directions and/or magnitudes of detected magnetic fields) corresponding to respective different external charger identities and selecting a charger identity based on such a comparison (e.g., selecting a charger whose corresponding specified magnetic field direction and magnitude most closely matches a detected magnetic field direction and magnitude).

In some examples, a magnetic field produced by an external charger could have one or more properties (e.g., a magnitude and/or orientation of a dipole moment, a field profile) that are related to and/or affected by proximity with a wearable device. For example, the wearable device could include a magnetic shim, a magnetic shield, or some other magnetic elements and/or materials such that a magnetic field produced by the external charger (e.g., by one or more permanent magnets and/or electromagnets of the external charger) is affected by the presence, relative location, relative orientation, or other properties of the wearable device. Additionally or alternatively, a wearable device could create a magnetic field (e.g., from one or more permanent magnets and/or electromagnets) that is affected by magnetic materials or elements of an external charger.

A wearable device (e.g., 100) could determine a location and/or orientation relative to an external charger, an identity of a proximate external charger, and/or some other information about an external charger based on detected properties or parameters in addition to a direction, magnitude, or other information about a magnetic field detected by a magnetometer of the wearable device. In some examples, the wearable device could include multiple magnetometers such that a magnetic field at multiple points in space separated by specified distances. In some examples, this could allow the wearable device to determine a magnetic field gradient, a magnetic field profile, or some other properties or information about a magnetic field that is related to the location, presence, identity, or other properties of an external charger. Additionally or alternatively, the wearable device could include an accelerometer and/or a gyroscope to allow the wearable device to detect motion of the wearable device such that, e.g., a single magnetometer could be used to detect a magnetic field profile or other information about a magnetic field that is related to an external charger by detecting a magnetic field using a magnetometer of the wearable device at multiple points in space. In some examples, a wearable device could include one or more electrical contacts configured to electrically connect with electrical contacts of an external charger, and the wearable device could operate the electrical contacts to detect whether one or more of the electrical contacts of the wearable device are electrically connected to electrical contacts of an external charger (e.g., by detecting a voltage between and/or current through the electrical contacts) and could combine such information with a detected magnetic field to determine information about the external charger. A wearable device could combine a variety of detected properties with one or more detected magnetic fields to determine information about a proximate external charger.

The wearable device could have access to information about the magnetic field profile of one or more external chargers relative to the location of a mounting surface, the location of an electrical contact, the identity, a set of services provided by, or some other properties or elements of one or more external chargers and could use such information, in combination with detected information about the detected magnetic field profile of an external charger proximate the wearable device to determine the identity of the external charger, the location and/or orientation of the external charger relative to the wearable device, or some other information about the external charger. For example, a set of external chargers could each include respective mounting surfaces on or within which each external charger could include a respective set of permanent magnets. The locations and/or orientations of the permanent magnets could be unique to each of the different external chargers such that the field profiles of each of the external chargers are different. In such examples, a wearable device could detect one or more properties of the field profile of an external charger (e.g., by detecting a magnitude and/or direction of a magnetic field proximate the external charger at one or more points in space) and could determine an identity of the external charger and/or determine the location and/or orientation of the external charger relative to the wearable device based on such detected one or more properties of the magnetic field.

A wearable device could determine an identity, a relative location, a relative orientation, or some other information about a proximate external charger based on a detected magnetic field to allow for a variety of applications. In some examples, the wearable device could perform functions based on a determined identity of an external charger. This could include changing an operational mode of the wearable device, providing an indication, changing information presented by the device (e.g., via a display), changing a method of presenting information by the device (e.g., changing a display theme, changing a speaker volume, changing an alert mode), or performing some other functions and/or changing a method of performing one or more functions based on the determined identity.

A wearable device could change an operational state based on a detected identity, relative location, or other property of a proximate external charger. For example, a wearable device could begin or cease recording some information (e.g., location information detected using a GPS receiver, physiological parameter information detected using a biosensor). In another example, a wearable device could enter a high-power mode (e.g., related to an amount of power provided by an external charger, e.g., via electrically connected electrical contacts of the wearable device and external charger) to charge a rechargeable battery, to perform some calculations, to communicate wirelessly with a remote system (e.g., to transmit recorded physiological parameter data via a cellular data link), or to perform some other high-power functions. In some examples, a wearable device could enter a data upload operational mode to transmit and/or back up data recorded by the wearable device (e.g., physiological parameter data, user input data) based on identification of an external charger, e.g., based on identifying an external charger that is configured to provide communications to the wearable device (e.g., to provide communications to a remote server to which the wearable device could transmit the recorded information).

Changing an operational mode of a wearable device based on a determined identity of an external charger could include changing a type and/or amount of information indicated and/or provided by the wearable device (e.g., using a display of the wearable device) and/or changing a method of indicating such information. For example, a wearable device could change a volume and/or sound used to provide audible alerts, could change a type of alert provided when a specified condition is met (e.g., could change an alert provided to indicate that a user has received an email from an audible alert to a vibration), could change an amount and/or type of information indicated on a display (e.g., whether to indicate the current time, whether to indicate a number of unread emails are present in a user's email account), could change a set of conditions that cause the wearable device to provide an alert indication or other indication (e.g., could silence audio or other alerts provided responsive to the user receiving an email), or could change some other property of the information provided and/or indicated by the wearable device. In some examples, changing an operational mode of the wearable device could include changing a brightness level of a display or other optical indicator (e.g., an LED, an OLED), a volume and/or duration of audible alerts or indications, an intensity or duration of vibratory alerts or indications, a text size, color, background, typeface, or other property as presented on a display, or some other property of indications provided by the wearable device.

In some examples, changing an operational mode of the wearable device based on a determined identity of an external charger could be related to services provided by the external charger. For example, determining an identity of an external charger could include determining an amount of power that the external charger can provide (e.g., via electrical contacts of the electrical charger that are electrically connected to corresponding electrical contacts of the wearable device); further, the wearable device could operate based on such a determination, e.g., to enter a specified battery recharging mode (e.g., a fast charge mode, a slow charge mode) based on an amount of power provided by the external charger. Additionally or alternatively, determining an identity of an external charger could include determining a type, bandwidth, or other properties of communications provided by the external charger (e.g., a high-bandwidth access to the internet requiring a username and password or other credentials, a medium-bandwidth access to a private network, a high-latency unsecured access to the internet).

In some examples, determining the identity of an external charger could be related to a location and/or usage context of the external charger and/or of the wearable device when mounted to and/or proximate to the external charger. For example, a first external charger could be located on a desk in a user's office and a second external charger could be located near a bed of a user's bedroom. In such examples, the wearable device could operate (e.g., change an operational mode) and/or perform functions related to the detected location and/or usage context. For example, a screen brightness of a display of the wearable device could be reduced and the wearable device could silence audible communications alerts (e.g., alerts related to reception of emails, text messages, or other communications) when the wearable device detects that it is proximate to the second charger (e.g., to minimize disruption of the user's sleep). In another example, the wearable device could provide additional indications (e.g., could provide, using a display of the wearable device, an indication of a number of unread emails that are in a user's email account) or operate in some other way when the wearable device detects that it is proximate to the first charger (e.g., to provide information or other functionality related to a user's work).

The location and/or orientation of a wearable device relative to an external charger and/or of one or more elements of a wearable device relative to one or more elements of an external charger (e.g., the location of an electrical contact of a wearable device relative to a corresponding electrical contact of an external charger) could be determined based on a detected magnetic field to provide a variety of functions according to a variety of applications. In some examples, the wearable device could be configured to perform some operation(s) when mounted to and/or located proximate to an external charger (e.g., to communicate with the external charger, to receive power from the external charger) and detecting the location of the wearable device relative to the external charger could provide some functionality relative to the operation(s). For example, the wearable device could be configured to receive power via one or more electrical contacts of the wearable device when the one or more contacts are electrically connected to corresponding electrical contacts of an external charger and the location of the electrical contact of the wearable device relative to corresponding electrical contact(s) of the external charger could be determined based on a detected magnetic field. This could include determining that the electrical contact of the wearable device is in electrical contact with the electrical contact of the external charger by determining that the location of the electrical contact of the wearable device is less than or approximately equal to a specified distance from the location of the corresponding electrical contact of the external charger.

In some examples, a wearable device could determine the location of the wearable device relative to an external charger (e.g., the location of one or more electrical contacts of the wearable device relative to corresponding electrical contacts of the external charger) and provide some indication to a user related to this determination, e.g., related to a determination that the wearable device is incorrectly mounted to the external device and/or that the wearable device is not mounted to the external device. In some examples, the wearable device could determine that the wearable device is proximate to an external charger (e.g., that the location of an electrical contact of the wearable device is less than some specified distance from a corresponding electrical contact of the external charger) and could further determined that the wearable device is not receiving power from the external charger (e.g., via the electrical contact); in response, the wearable device could provide an indication to a user (e.g., via a display of the wearable device) that the wearable device is incorrectly mounted to the external charger or that the wearable device is otherwise not receiving power from the external charger. In some examples, the wearable device could determine that the orientation and/or location of the wearable device relative to an external charger is not such that the wearable device could receive power from (or otherwise interact with) the external charger (e.g., the wearable device is mounted to the external charger upside-down). In response, the wearable device could determine a change in the orientation and/or location of the wearable device relative to the external charger such that the wearable device could receive power (e.g., such that an electrical contact on the wearable device could be electrically connected to a corresponding electrical contact of the external charger). Further, the wearable device could provide an indication of this determined change in orientation and/or location to a user (e.g., via a display of the wearable device). Other determinations performed by the wearable device related to the determined location and/or orientation of the wearable device relative to an external charger and operations related thereto are anticipated.

In some examples, a wearable device could determine an operational status of an external charger (e.g., that the external charger is deactivated, that the external charger is unpowered, that the external charger is otherwise inactive) and provide some indication to a user related to this determination and/or perform could other operation(s) related to this determination. In some examples, this could include the wearable device determining that the wearable device is mounted to an external charger (e.g., that the location of an electrical contact of the wearable device is less than some specified distance from a corresponding electrical contact of the external charger) and could further include determining that the wearable device is not receiving power from the external charger (e.g., via the electrical contact). In response, the wearable device could provide an indication to a user (e.g., via a display of the wearable device) that the external charger is inactive. This could include providing an indication of the location of a switch or button on the external charger that the user could operate to activate the external charger. In some examples, the wearable device could, in response to the determination described above, send a command to the external device (e.g., via a wireless link, by applying a signal to one or more electrical contacts of the wearable device that are electrically connected to the external charger) to activate the external charger.

Note that the configurations and operations of devices (e.g., wearable devices, external chargers, other external systems, other systems configured to mount to or otherwise interact with external chargers and/or other external systems) as described herein are meant as non-limiting examples of operation of a first system to determine an identity, relative location, relative orientation, configuration, status, or other properties of a second system based on one or more properties of a magnetic field detected by a magnetometer of the first system. Such operations and/or configurations could be applied to change an operational mode of the first and/or second systems, to provide an indication to a user (e.g., using a display of the first system), or to provide some other outcome according to an application.

III. EXAMPLE WEARABLE DEVICES

Wearable devices as described herein can be configured to be mounted to an external body surface of a wearer and to enable a variety of applications and functions including the detection of physiological properties of the wearer (e.g., a flow rate of blood, a blood oxygenation, a blood pressure, an electrocardiographic (ECG) signal), the detection of properties of the environment of the wearer (e.g., an ambient temperature, a barometric pressure), the presentation of information to the wearer (e.g., a current time, the contents of an email received by the wearer, information detected by the wearable device about physiological properties of the wearer), or other applications. Such wearable devices can additionally be configured to be mounted to, to communicate with, to receive power from, or to otherwise interact with external charger, docking stations, or other external systems, e.g., through an electrical connection between corresponding electrical contacts of the wearable device and the external system (e.g., external charger).

Such wearable devices could additionally include one or more magnetometers configured to detect a magnetic field produced by, modified by, or otherwise having one or more detectable properties related to a configuration, status, operational state, relative location or orientation, or other property of the external system. Further, such wearable devices could determine such properties of the external system (e.g., that the location and/or orientation of the wearable device relative to an external charger was such that an electrical contact of the wearable device is in electrical contact with and/or located less than or approximately equal to a specified distance from a corresponding contact of the external charger) and operate based on such determinations, e.g., by changing an operational state, changing the method or type of indicating information using a display, indicating that the wearable device is improperly mounted to the external system, or operating in some other way.

Figure 4:
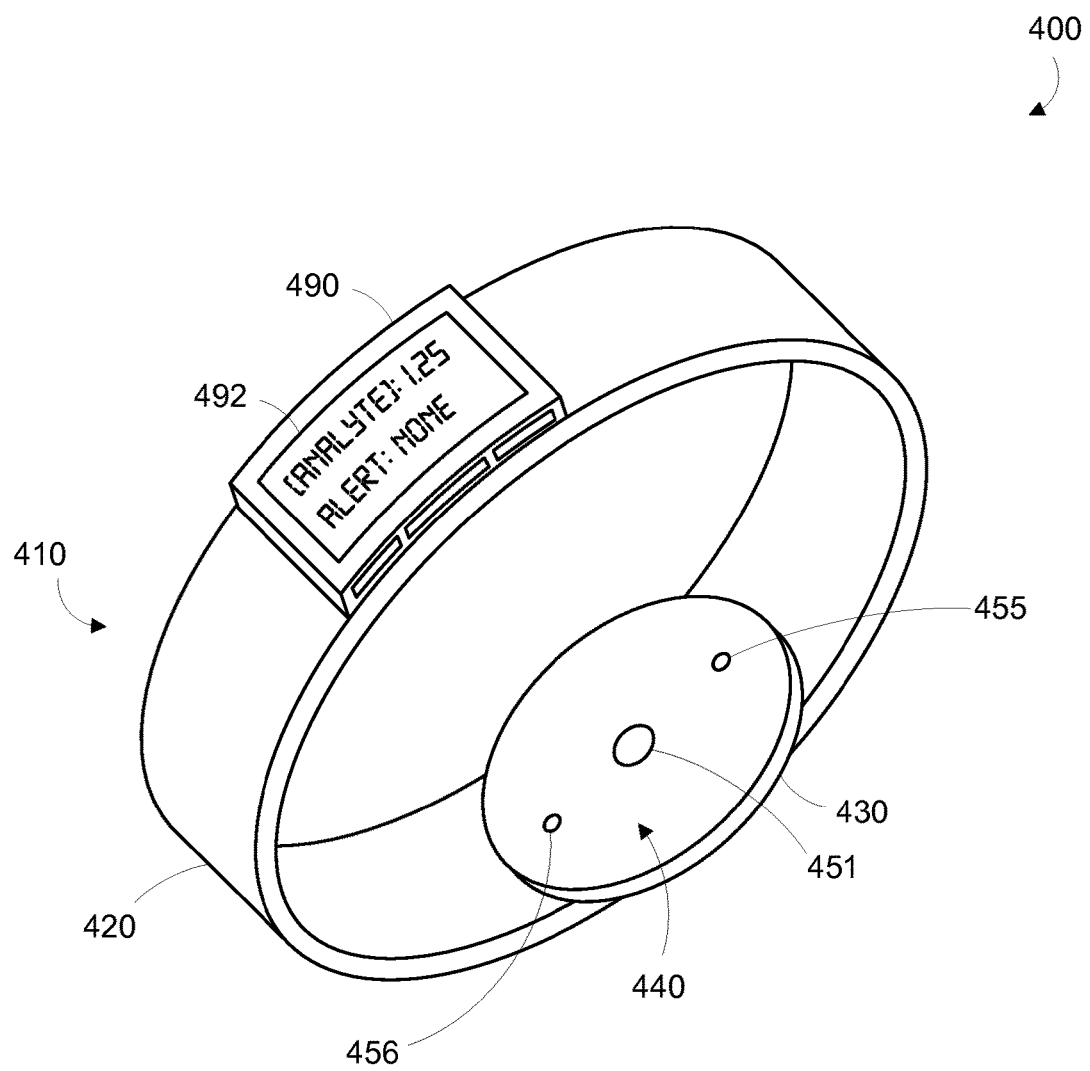
FIG. 4 is a perspective view of an example wearable device.

A wearable device 400 (illustrated in FIG. 4) can be configured to mounted to an external charger (or other external system) and to detect a magnetic field produced by, modified by, or otherwise having one or more properties related to the external charger. The term "wearable device," as used in this disclosure, refers to any device that is capable of being worn at, on or in proximity to a body surface, such as a wrist, ankle, waist, chest, or other body part. In order to provide applications of the wearable device (e.g., to provide indications of information, to detect physiological parameters of a wearer), the wearable device may be positioned on a portion of the body where the wearable device can be easily viewed and/or interacted with (e.g., buttons pressed), on a portion where subsurface vasculature or other targets or elements of the body of the wearer are easily observable, or on a location according to some other consideration. The device may be placed in close proximity to the skin or tissue. A mount 410, such as a belt, wristband, ankle band, etc. can be provided to mount the device at, on or in proximity to the body surface. The mount 410 may prevent the wearable device from moving relative to the body to reduce physiological parameter measurement error and noise. In one example, shown in FIG. 4, the mount 410, may take the form of a strap or band 420 that can be worn around a part of the body. Further, the mount 410 may be an adhesive substrate for adhering the wearable device 400 to the body of a wearer.

A housing 430 is disposed on the mount 410 such that it can be positioned on the body. A contact surface 440 of the housing 430 is intended to be mounted facing to the external body surface. The housing 430 may include one or more sensors (e.g., 451) configured to detect one or more physiological parameters of the wearer (e.g., a pulse rate, a blood oxygenation, a blood pressure, a blood flow rate). The housing additionally includes electrical contacts 455, 456 configured to electrically connect with corresponding electrical contacts of an external charger (or other external system) when the wearable device is mounted to the external charger (e.g., to receive power from the external charger, to communicate with the external charger, or to otherwise interact with the external charger electrically via the electrical contacts 455, 456). The housing 430 could be configured to be water-resistant and/or water-proof. That is, the housing 430 could be configured to include sealants, adhesives, gaskets, welds, transparent windows, apertures, press-fitted seams, and/or other joints such that the housing 430 was resistant to water entering an internal volume or volumes of the housing 430 when the housing 430 is exposed to water. The housing 430 could further be water-proof, i.e., resistant to water entering an internal volume or volumes of the housing 430 when the housing 430 is submerged in water. For example, the housing 430 could be water-proof to a depth of 1 meter, i.e., configured to resist water entering an internal volume or volumes of the housing 430 when the housing 430 is submerged to a depth of 1 meter.

The wearable device 400 may also include a user interface 490 via which the wearer of the device may receive one or more recommendations or alerts generated either from a remote server or other remote computing device, or from a processor within the device. The alerts could be any indication that can be noticed by the person wearing the wearable device. For example, the alert could include a visual component (e.g., textual or graphical information on a display), an auditory component (e.g., an alarm sound), and/or tactile component (e.g., a vibration). Further, the user interface 490 may include a display 492 where a visual indication of the alert or recommendation may be displayed. The display 492 may further be configured to provide an indication of the measured alignment and/or relative location of the wearable device 400 relative to an external charger and/or to indicate an adjustment which could be made by a user to correctly mount the wearable device to an external charger (e.g., such that the electrical contacts 455, 456 are electrically connected with corresponding contacts of the external charger).

Note that example devices herein are configured to be mounted to a wrist of a wearer. However, the embodiments described herein could be applied to other body parts (e.g., an ankle, a thigh, a chest, a forehead, a thigh, a finger). Further, embodiments described herein could be applied to devices that are not wearable, e.g., that are handheld, desktop, or otherwise configured. Further, such devices could be configured to operate in other environment than environments proximate a human body to provide other functions, e.g., to detect one or more properties of some other target environment (e.g., a natural environment, an environment of an industrial, pharmaceutical, or water treatment process).

Wearable devices and other embodiments as described herein can include a variety of components configured in a variety of ways. Devices described herein could include electronics including a variety of different components configured in a variety of ways to enable applications of the wearable device. The electronics could include controllers, amplifiers, switches, battery chargers, RF power receivers, display drivers, touch sensors, wireless communications chipsets (e.g., Bluetooth radios or other radio transceivers and associated baseband circuitry to enable wireless communications between the wearable device and some other system(s)), or other components. The electronics could include a controller configured to operate one or more magnetometers and/or components of magnetometers to detect one or more properties of a magnetic field such that one or more properties (e.g., an identity, a locational or operational context, an operational state, a location and/or orientation relative to the wearable device) of an external charger or other external system can be determined based on the detected magnetic field. The controller could include a processor configured to execute computer-readable instructions (e.g., program instructions stored in data storage of the wearable device) to enable applications of the wearable device. The electronics can include additional or alternative components according to an application of the wearable device.

Wearable devices as described herein could include one or more user interfaces. A user interface could include a display configured to present an image to a wearer and to detect one or more finger presses of a wearer on the interface. The controller or some other component(s) of the electronics could operate the user interface to provide information to a wearer or other user of the device and to enable the wearer or other user to affect the operation of the wearable device, to determine some property of the wearable device and/or of the wearer of the wearable device (e.g., a hemodynamic property of a portion of subsurface vasculature and/or a health state of a wearer of the wearable device), or to provide some other functionality or application to the wearer and/or user. As one example, the wearer could press an indicated region of the user interface to indicate that the wearable device should begin logging detected medical information about the wearer. Other indicated information, changes in operation of the wearable device, or other functions and applications of the user interface are anticipated.

Note that the embodiments illustrated in the Figures are illustrative examples and not meant to be limiting. Alternative embodiments, including more or fewer components in alternative configurations are anticipated. A wearable device could include multiple housings or other such assemblies each containing some set of components to enable applications of such a wearable device. For example, a wearable device could include a first housing within which is disposed a magnetometer and on which are disposed one or more electrical contacts configured to electrically connect with corresponding electrical contacts of an external charger and a second housing containing a user interface and electronics configured to operate the magnetometer and electrical contacts and to present information to and receive commands from a user of the wearable device. A wearable device could be configured to perform a variety of functions and to enable a variety of applications. Wearable devices could be configured to operate in concert with other devices or systems; for example, wearable devices could include a wireless communication interface configured to transmit data indicative of one or more detected properties of the body of a wearer of the wearable device and/or information about user inputs received from the wearer by a user interface (e.g., buttons, a touchscreen) of the wearable device. Other embodiments, operations, configurations, and applications of a wearable device as described herein are anticipated.

Figure 5:
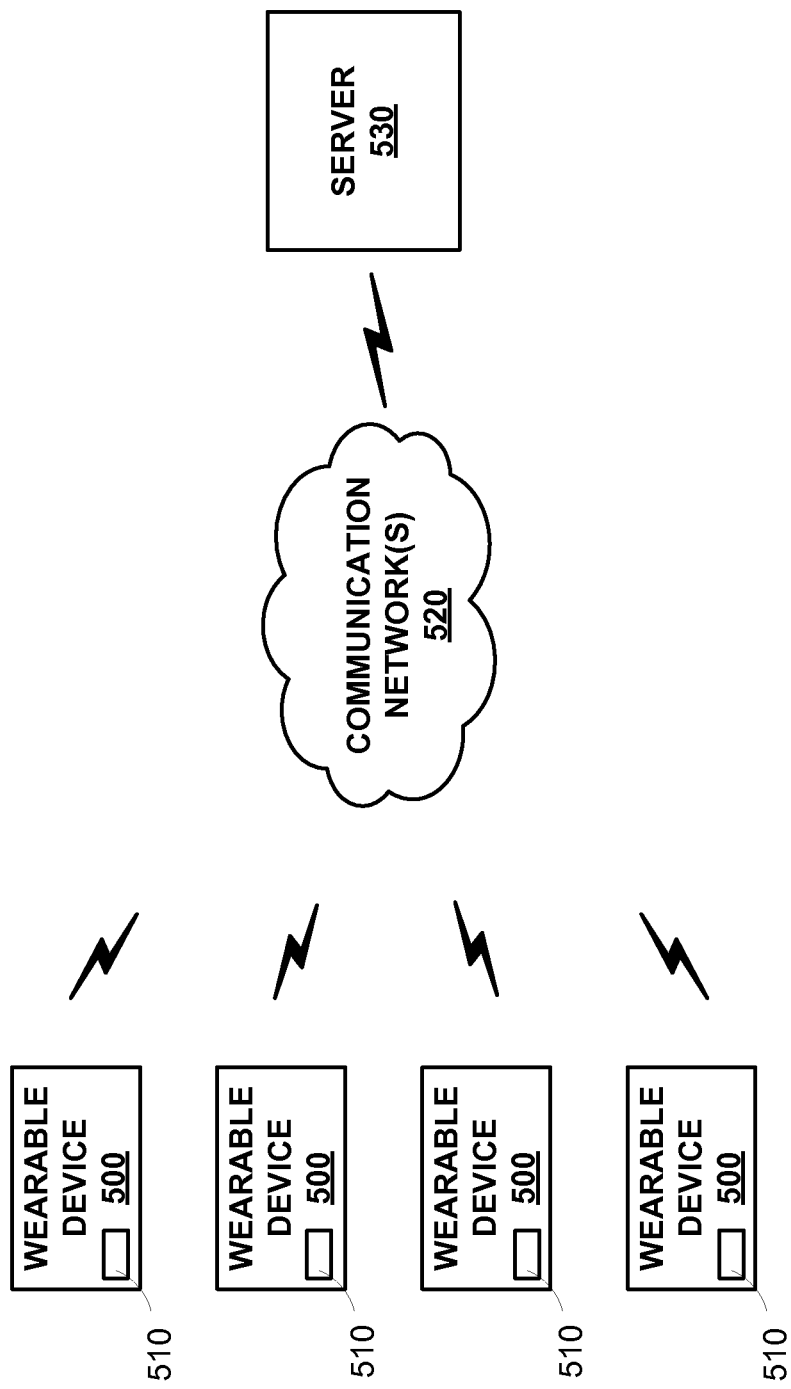
FIG. 5 is a block diagram of an example system that includes a plurality of wearable devices in communication with a server.

FIG. 5 is a simplified schematic of a system including one or more wearable devices 500. The one or more wearable devices 500 may be configured to transmit data via a communication interface 510 over one or more communication networks 520 to a remote server 530. In one embodiment, the communication interface 510 includes a wireless transceiver for sending and receiving communications to and from the server 530. In further embodiments, the communication interface 510 may include any means for the transfer of data, including both wired and wireless communications. For example, the communication interface may include a universal serial bus (USB) interface or a secure digital (SD) card interface. Communication networks 520 may be any one of may be one of: a plain old telephone service (POTS) network, a cellular network, a fiber network and a data network. In some examples, the communications interface 510 could include one or more electrical contacts of the wearable devices 500 that are configured to electrically connect to an external charger or other system(s) of the communication networks 520 such that the wearable device 500 could communicate with the communication networks 520 via the electrical contacts when the wearable devices 500 are mounted to the external charger. The server 530 may include any type of remote computing device or remote cloud computing network. Further, communication network 520 may include one or more intermediaries, including, for example wherein the wearable device 500 transmits data to a mobile phone or other personal computing device, which in turn transmits the data to the server 530.

In addition to receiving communications from the wearable device 500, such as collected physiological properties of a wearer or other collected information (e.g., information input by the user into the wearable devices 500 via a user interface of the devices 500), the server 530 may also be configured to gather and/or receive either from the wearable device 500 or from some other source, information regarding a wearer's overall medical history, environmental factors, user profiles, login information, geographical data, or other information. For example, a user account may be established on the server for every wearer that contains the wearer's medical history. Moreover, in some examples, the server 530 may be configured to regularly receive information from sources of environmental data, such as viral illness or food poisoning outbreak data from the Centers for Disease Control (CDC) and weather, pollution and allergen data from the National Weather Service. Further, the server may be configured to receive data regarding a wearer's health state from a hospital or physician. Such information may be used in the server's decision-making process, such as recognizing correlations and in generating clinical protocols.

Additionally, the server may be configured to gather and/or receive the date, time of day and geographical location of each wearer of the device during each measurement period. Such information may be used to detect and monitor spatial and temporal spreading of diseases. As such, the wearable device may be configured to determine and/or provide an indication of its own location. For example, a wearable device may include a GPS system so that it can include GPS location information (e.g., GPS coordinates) in a communication to the server. As another example, a wearable device may use a technique that involves triangulation (e.g., between base stations in a cellular network) to determine its location. Other location-determination techniques are also possible.

Further, some embodiments of the system may include privacy controls which may be automatically implemented or controlled by the wearer of the device. For example, where a wearer's collected hemodynamic property data and health state data are uploaded to a cloud computing network for trend analysis by a clinician, the data may be treated in one or more ways before it is stored or used, so that personally identifiable information is removed. For example, a user's identity may be treated so that no personally identifiable information can be determined for the user, or a user's geographic location may be generalized where location information is obtained (such as to a city, ZIP code, or state level), so that a particular location of a user cannot be determined.

Additionally or alternatively, wearers of a device may be provided with an opportunity to control whether or how the device collects information about the wearer (e.g., information about a user's medical history, social actions or activities, profession, a user's preferences, or a user's current location), or to control how such information may be used. Thus, the wearer may have control over how information is collected about him or her and used by a clinician or physician or other user of the data. For example, a wearer may elect that data, such as health state and hemodynamic properties, collected from his or her device may only be used for generating an individual baseline and recommendations in response to collection and comparison of his or her own data and may not be used in generating a population baseline or for use in population correlation studies.

IV. EXAMPLE ELECTRONICS

Figure 6:
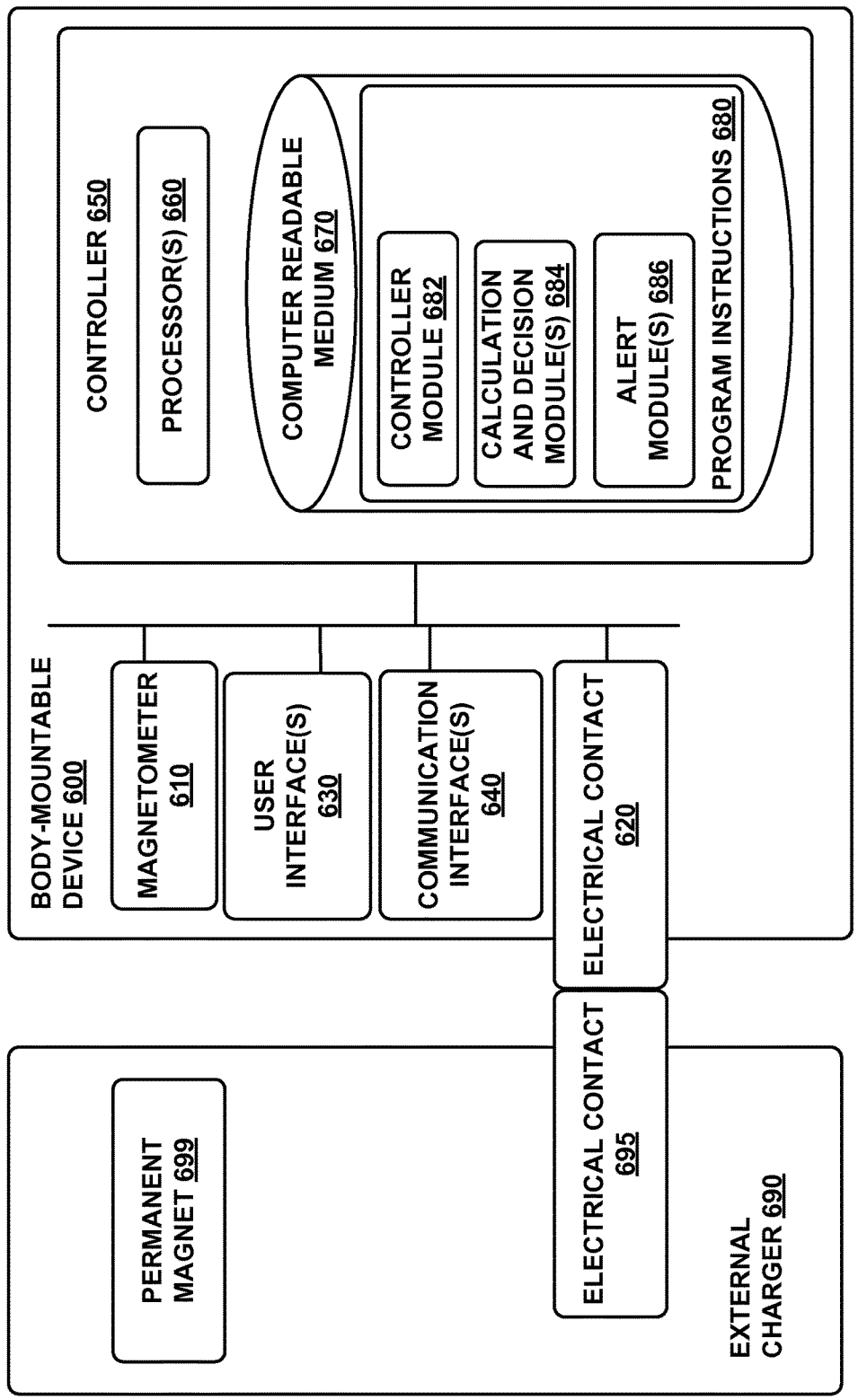
FIG. 6 is a functional block diagram of an example device.

FIG. 6 is a simplified block diagram illustrating the components of a body-mountable device 600 and an external charger 690, according to an example embodiment. Device 600 may take the form of or be similar to one of the wearable devices 100, 400 shown in FIGS. 1A, 1B, 2B, 3, and 4. However, device 600 may also take other forms, such as an ankle, waist, or chest-mounted device. Device 600 could also take the form of a device that is not configured to be mounted to a body. For example, device 600 could take the form of a handheld device configured to be maintained in proximity to an environment of interest (e.g., a body part, a biological sample container, a volume of a water treatment system) by a user or operator of the device 600 or by a frame or other supporting structure. Device 600 also could take other forms. External charger 690 may take the form of or be similar to the external charger 200 shown in FIGS. 2A, 2B, and 3. However, external charger 690 could take other forms.

In particular, FIG. 6 shows an example of a device 600 having a magnetometer 610, an electrical contact 620, a user interface 630, communication interface 640 for transmitting data to a remote system, and a controller 650. The components of the device 600 may be disposed on a mount or on some other structure for mounting the device to a location of interest, e.g., to a location (e.g., a wrist) of a body of a wearer of the device 600. The external charger 690 includes a permanent magnet 699 configured to produce a magnetic field that can be detected by the magnetometer 610 and an electrical contact 695 configured to electrically connect to the electrical contact 620 of the device 600.

Controller 650 may be provided as a computing device that includes one or more processors 660. The one or more processors 660 can be configured to execute computer-readable program instructions 680 that are stored in the computer readable data storage 670 and that are executable to provide the functionality of a device 600 described herein.

The computer readable medium 670 may include or take the form of one or more non-transitory, computer-readable storage media that can be read or accessed by at least one processor 660. The one or more computer-readable storage media can include volatile and/or non-volatile storage components, such as optical, magnetic, organic or other memory or disc storage, which can be integrated in whole or in part with at least one of the one or more processors 660. In some embodiments, the computer readable medium 670 can be implemented using a single physical device (e.g., one optical, magnetic, organic or other memory or disc storage unit), while in other embodiments, the computer readable medium 670 can be implemented using two or more physical devices.

The magnetometer 610 could include any components or elements configured to detect one or more properties of a magnetic field at one or more locations relative to the device 600. Such components or elements could be configured to measure a magnitude, direction, frequency, power spectrum, polarity, or other properties of a magnetic field at one or more locations. For example, the magnetometer 610 could include three magnetic field sensitive elements configured to detect the magnitude of a magnetic field at substantially the same specified location in respective different directions (e.g., respective orthogonal directions) such that the magnitude and direction of the magnetic field at the specified location can be detected and/or determined using the three magnetic field sensitive elements. The magnetometer 610 could include one or more Hall Effect sensors, magnetoresistance sensors, giant magnetoresistance sensors, magnetoimpedance sensors (e.g., wire magnetoimpedance sensors), inductive pickup coils, fluxgate magnetometers, spin-exchange relaxation-free magnetometers, or other magnetically sensitive components or elements. In some examples, the magnetometer 610 could be configured to detect a magnetic field produced by the Earth, e.g., to produce navigational information related to the location and/or orientation of the device 600 when the device 600 is not proximate to the permanent magnet 699 of the external charger 690.

The program instructions 680 stored on the computer readable medium 670 may include instructions to perform any of the methods described herein. For instance, in the illustrated embodiment, program instructions 680 include a controller module 682, calculation and decision module 684 and an alert module 686.

Calculation and decision module 684 may include instructions for operating the magnetometer and analyzing data generated by the magnetometer to determine one or more properties (e.g., an identity, a relative location and/or orientation) of the external charger 690 or of some other external system proximate the device 600. Calculation and decision module 684 can additionally include instructions for operating an accelerometer or other sensors of the device, detecting whether the device 600 is receiving power via the electrical contact 620, or other operations related to the operation of the device 600 to determine properties of the external charger 690. Calculation and decision module 684 can further include instructions for determining whether the device 600 is properly mounted to the external charger 690, determining an identity of the external charger 690, determining that the external charger 690 is inactive, determining a change in orientation and/or location of the device 600 relative to the external charger 690 such that the device 600 could interact with the external charger 690 in some specified way (e.g., such that the device 600 could receive power from the external charger 690 via the electrical contact 620), or other analytical processes relating to external charger or other external systems in the environment proximate to the device 600. These instructions could be executed at each of a set of preset measurement times.

The controller module 682 can include instructions for operating a user interface 620. For example, controller module 682 may include instructions for displaying data collected by the magnetometer 610 and analyzed by the calculation and decision module 684, or for displaying one or more alerts generated by the alert module 686. The controller module 682 can include instructions for operating the user interface 630 based on a determination of the calculation and decision module 684 (e.g., a determination that the device 600 is mounted to the external charger 690, a determination of an identity of the external charger 690). For example, the calculation and decision module 684 could include instructions to change a brightness level of a display of the user interface 630, to change an amount and/or type of information indicated using a display of the user interface 630, to change a volume level of audible alerts generated by the user interface 630, or to change the use of the interface to provide indications in some other way. Controller module 682 may include instructions for displaying data related to a user account of a user, e.g., a number of unread emails in a user's email account, the content of an email received by the user, or some other information. Further, controller module 682 may include instructions to execute certain functions based on inputs accepted by the user interface 620, such as inputs accepted by one or more buttons disposed on the user interface.

Communication platform 640 may also be operated by instructions within the controller module 682, such as instructions for sending and/or receiving information via a wireless antenna, which may be disposed on or in the device 600. The communication interface 640 can optionally include one or more oscillators, mixers, frequency injectors, etc. to modulate and/or demodulate information on a carrier frequency to be transmitted and/or received by the antenna. In some examples, the device 600 is configured to indicate an output from the processor by modulating an impedance of the antenna in a manner that is perceivable by a remote server or other remote computing device. The communication platform 640 could additionally or alternatively be configured to communicate via the electrical contact 620, e.g., by transmitting signals through and/or receiving signals from the electrical contact 620.

The computer readable medium 670 may further contain other data or information, such as medical and health history of a user of the device 600, user account information, user credentials (e.g., usernames, passwords, cryptographic keys and/or certificates), that may be useful in performing functions of the device 600. In some examples, the device 600 could be configured to detect one or more physiological parameters of a user (e.g., a heart rate, a blood oxygenation, a blood pressure, the presence and/or concentration of one or more analytes in the blood of a wearer) and the computer readable medium 670 could contain information related to such physiological parameter detection (e.g., sensor calibration information, physiological parameter baselines of a user, physiological parameter levels indicative of a medical condition). The calculation and decision module 684 may be configured to use such stored information to determine whether a wearer is experiencing a medical condition and may further, upon determining that such a medical or other emergency condition is indicated, generate one or more recommendations for the user of the device 600 based, at least in part, on consultation of a clinical protocol. Such recommendations may alternatively be generated by a remote server and transmitted to the device 600.

In some examples, information collected by the device 600 (e.g., collected physiological property data, baseline profiles, health state information input by device users) may be input to a cloud network and be made available for download by a user's physician. Trend and other analyses may also be performed on the collected data, such as hemodynamic property data and health state information, in the cloud computing network and be made available for download by physicians or clinicians.

In response to a determination by the calculation and decision module 684 that a medical or other specified condition is indicated, the alert module 686 may generate an alert via the user interface 620. The alert may include a visual component, such as textual or graphical information displayed on a display, an auditory component (e.g., an alarm sound), and/or tactile component (e.g., a vibration). The textual information may include one or more recommendations, such as a recommendation that the user of the device contact a medical professional, seek immediate medical attention, or administer a medication.

In some examples, the calculation and decision module 684 may determine that the device 600 is proximate the external charger 690 but that the device 600 is not receiving power. In such examples, the alert module 686 could generate an alert to indicate that the device 600 is not receiving power. Such a generated alert could further include an indication that the external charger 690 is inactive, an indication that the device 600 is improperly mounted to the external charger 690, an indication of a determined change in the location and/or orientation of the device 600 such that the device 600 could receive power from or otherwise interact with the external charger 690, or could include some other information.

V. EXAMPLE METHODS

Figure 7:
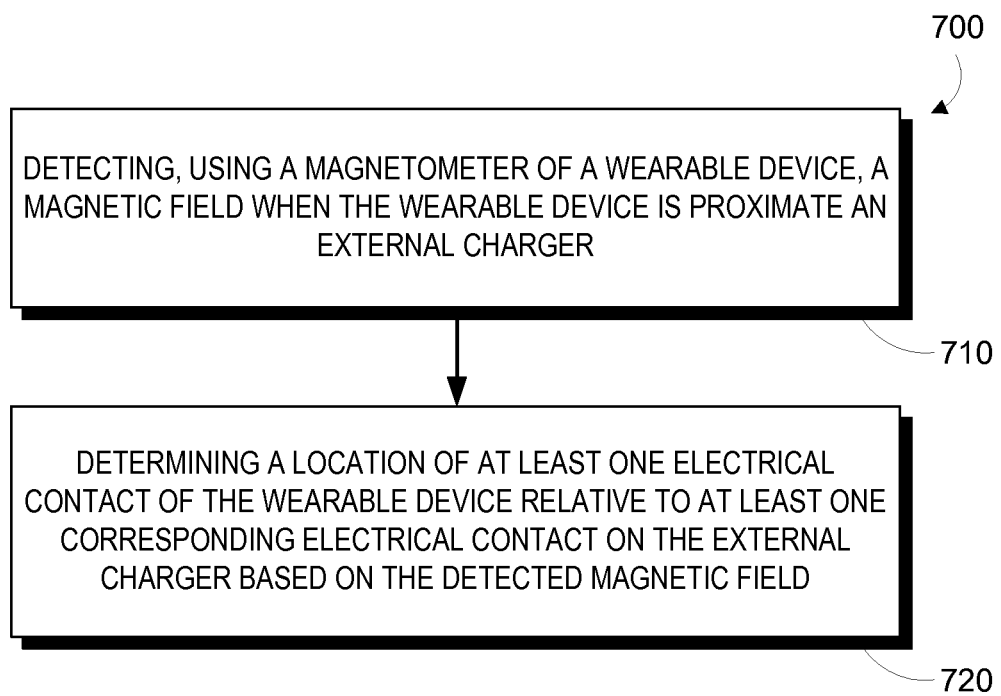
FIG. 7 is a flowchart of an example method.

FIG. 7 is a flowchart of a method 700 for operating a wearable device. The operated wearable device includes: (i) a magnetometer; (ii) at least one electrical contact on a surface of the wearable device that is configured to electrically connect to at least one corresponding electrical contact on an external charger; and (iii) a controller operably coupled to the magnetometer and configured to perform controller operations related to performing the method 700.

The method 700 includes the controller detecting, using the magnetometer, a magnetic field when the wearable device is proximate the external charger (710). This could include operating the magnetometer in any of a variety of ways to detect any of a variety of properties of a magnetic field as described elsewhere herein. Properties detected by the magnetometer could include a direction, magnitude, frequency, power spectrum, gradient magnitude, gradient direction, or other properties of a magnetic field at one or more locations in one or more specified directions at one or more points in time.

The method 700 also includes the controller determining a location of the at least one electrical contact of the wearable device relative to the at least one corresponding electrical contact on the external charger based on the detected magnetic field (720). This could include determining the location and/or orientation of the wearable device relative to the external charger based on the magnetic field. This could include determining that the location and/or orientation of the wearable device and/or of the electrical contact, relative to the external charger and/or the corresponding electrical contact of the external charger, is one of a set of locations and/or orientations and/or is within a range of locations and/or orientations. Determining a location of the at least one electrical contact of the wearable device (720) could include determining that the location of the contact has a distance from the corresponding electrical contact of the external charger that is less than or approximately equal to a specified distance and/or determining that the electrical contact is sufficiently close to the corresponding electrical contact of the external charger that the electrical contacts are electrically connected.

The method 700 for operating a wearable device could include additional steps relating to detection of a magnetic field and using such a detected magnetic field to determine information about an external charger and/or a relationship between the external charger and the wearable device. For example, the method 700 could include mounting the wearable device to an external body surface using a mount. The method 700 could include determining that the wearable device is incorrectly mounted to the external charger, that the external charger is inactive, that the location and/or orientation of the wearable device could be changed by an amount such that the electrical contact is electrically connected to the corresponding electrical contact of the external charger, or could include making some other determination. The method 700 could further include providing an indication related to such determinations, e.g., such that user could correctly mount the wearable device to the charger, activate the external charger, or perform some other action based on the provided indication. The method 700 could include identifying the external charger based on the detected magnetic field and performing some functions based on such determination (e.g., changing an operational state of the wearable device based on a determined identity of the external charger).

In some examples, the wearable device could include one or more sensors configured to detect one or more physiological properties of a wearer and the method 700 could include operating the one or more sensors of the wearable device to detect a the one or more physiological properties of the wearer. Physiological properties detected by the one or more sensors could include properties of a wearer's heart, a wearer's blood, a heart rate, a blood flow rate, a blood pressure, the presence and/or concentration of one or more analytes in blood or other fluids of the wearer, an electromyogram, a Galvanic skin response, or some other physiological properties. The one or more sensors could include temperature sensors, energy sensors, electromagnetic sensors, light sensors, chemical sensors, acoustical sensors, infrared sensors, ultraviolet sensors, tonometers, electrocardiogram electrodes, tissue impedance electrodes, or other types of sensors. In some examples, one or more of the sensors could include energy emitters (e.g., light emitters, heaters, acoustical transducers, current sources, voltage sources) configured to enable detection of some physiological property of a body of a wearer by illuminating, heating, injecting a current into, applying a voltage to, or otherwise introducing an energy to the one or more portions of the body of the wearer. In some examples, the one or more sensors could include active optical sensors configured to illuminate a portion of subsurface vasculature and/or blood therein and the detect light responsively emitted from the portion of subsurface vasculature. Such sensors could include laser Doppler flowmeters, dynamic laser speckle sensors, photoplethysmographic sensors, fluorescence imagers, or some other active and/or passive optical sensors.

The example method 700 illustrated in FIG. 7 is meant as an illustrative, non-limiting example. Additional or alternative elements of the method and additional or alternative components of the wearable device are anticipated, as will be obvious to one skilled in the art.

VI. CONCLUSION

Where example embodiments involve information related to a person or a device of a person, the embodiments should be understood to include privacy controls. Such privacy controls include, at least, anonymization of device identifiers, transparency and user controls, including functionality that would enable users to modify or delete information relating to the user's use of a product.

Further, in situations in where embodiments discussed herein collect personal information about users, or may make use of personal information, the users may be provided with an opportunity to control whether programs or features collect user information (e.g., information about a user's medical history, social network, social actions or activities, profession, a user's preferences, or a user's current location), or to control whether and/or how to receive content from the content server that may be more relevant to the user. In addition, certain data may be treated in one or more ways before it is stored or used, so that personally identifiable information is removed. For example, a user's identity may be treated so that no personally identifiable information can be determined for the user, or a user's geographic location may be generalized where location information is obtained (such as to a city, ZIP code, or state level), so that a particular location of a user cannot be determined. Thus, the user may have control over how information is collected about the user and used by a content server.

The particular arrangements shown in the Figures should not be viewed as limiting. It should be understood that other embodiments may include more or less of each element shown in a given Figure. Further, some of the illustrated elements may be combined or omitted. Yet further, an exemplary embodiment may include elements that are not illustrated in the Figures.

Additionally, while various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are contemplated herein.

What is claimed is:

1. A wearable device comprising:
    a magnetometer;
    at least one electrical contact on a surface of the wearable device, wherein the at least one electrical contact is configured to electrically connect to at least one corresponding electrical contact on an external system; and
    a controller, wherein the controller is operably coupled to the magnetometer, and wherein the controller is configured to perform controller operations comprising:
        detecting, using the magnetometer, a magnetic field when the wearable device is proximate to the external system; and
        determining a location and an orientation of the at least one electrical contact on the wearable device relative to the at least one corresponding electrical contact on the external system based on the detected magnetic field.

2. The wearable device of claim 1, further comprising a mount configured to mount the wearable device to a wrist location.

3. The wearable device of claim 1, wherein detecting a magnetic field using the magnetometer comprises detecting a magnitude and a direction of the magnetic field.

4. The wearable device of claim 1, wherein the magnetometer comprises at least one magnetoimpedance sensor.

5. The wearable device of claim 1, wherein the wearable device further comprises an output component, wherein the controller is operably coupled to the output component, and wherein the controller operations further comprise:
    determining whether the wearable device is mounted to the external system based on the determined location and orientation of the at least one electrical contact on the wearable device relative to the at least one corresponding electrical contact on the external system;
    determining whether the at least one electrical contact on the wearable device is receiving power from the external system; and
    responsive to determining that the at least one electrical contact on the wearable device is not receiving power from the external system and that the wearable device is mounted to the external system, providing an indication, using the output component, that the external system is inactive.

6. The wearable device of claim 1, wherein the wearable device further comprises an output component, wherein the controller is operably coupled to the output component, and wherein the controller operations further comprise:
    determining whether the wearable device is proximate to the external system based on the determined location and orientation of the at least one electrical contact on the wearable device relative to the at least one corresponding electrical contact on the external system;
    determining whether the at least one electrical contact on the wearable device is receiving power from the external system; and
    responsive to determining that the at least one electrical contact on the wearable device is not receiving power from the external system and that the wearable device is proximate to the external system, providing an indication, using the output component, that the wearable device is not receiving power from the external system.

7. The wearable device of claim 1, wherein detecting a magnetic field using the magnetometer comprises detecting a magnitude and a direction of the magnetic field, and wherein the controller operations further comprise:
    determining an identity of the external system based on the detected direction and magnitude of the magnetic field.

8. The wearable device of claim 7, wherein determining the identity of the external system based on the detected direction and magnitude of the magnetic field comprises:
    comparing the detected direction and magnitude of the magnetic field with a set of specified directions and magnitudes corresponding to a set of external system identities; and
    selecting an identity from the set of external system identities based on the comparison between the detected direction and magnitude of the magnetic field and the set of specified directions and magnitudes.

9. The wearable device of claim 7, wherein the controller operations further comprise:
    changing an operational mode of the wearable device based on the determined identity of the external system.

10. The wearable device of claim 1, further comprising a magnetic material, wherein the magnetic material is configured to receive a magnetic force from a magnet of the external system when the magnetic material of the wearable device is proximate the magnet of the external system, and wherein the magnetic force received by the magnetic material acts to align the at least one electrical contact on the wearable device with the at least one corresponding electrical contact on the external system such that the at least one electrical contact on the wearable device can receive power from the external system.

11. The wearable device of claim 1, further comprising a rechargeable battery, wherein the battery is configured to power the wearable device, and wherein the wearable device is configured to recharge the rechargeable battery using power received from the external system via the at least one electrical contact on the wearable device.

12. A wearable device comprising:
a magnetometer;
at least one electrical contact on a surface of the wearable device, wherein the at least one electrical contact is configured to electrically connect to at least one corresponding electrical contact on an external system;
an output component; and
a controller, wherein the controller is operably coupled to the magnetometer and the output component, and wherein the controller is configured to perform controller operations comprising:
detecting, using the magnetometer, a magnetic field when the wearable device is proximate to the external system;
determining an orientation of the wearable device relative to the external system based on the detected magnetic field;
determining a change in the orientation of the wearable device relative to the external system such that the at least one electrical contact on the wearable device could receive power from the external system; and
providing, using the output component, an indication related to the determined change in the orientation of the wearable device relative to the external system.

13. A method comprising:
operating a wearable device, wherein the wearable device comprises:
a magnetometer;
at least one electrical contact on a surface of the wearable device, wherein the at least one electrical contact is configured to electrically connect to at least one corresponding electrical contact on an external system; and
a controller, wherein the controller is operably coupled to the magnetometer; and wherein operating the wearable device comprises:
detecting, by the controller using the magnetometer, a magnetic field when the wearable device is proximate to the external system; and
determining, by the controller, a location and an orientation of the at least one electrical contact on the wearable device relative to the at least one corresponding electrical contact on the external system based on the detected magnetic field.

14. The method of claim 13, wherein detecting, by the controller using the magnetometer, a magnetic field comprises detecting a magnitude and a direction of the magnetic field.

15. The method of claim 13, wherein the wearable device further comprises an output component, wherein the controller is operably coupled to the output component, and further comprising:
determining, by the controller, whether the wearable device is mounted to the external system based on the determined location and orientation of the at least one electrical contact on the wearable device relative to the at least one corresponding electrical contact on the external system;
determining, by the controller, whether the at least one electrical contact on the wearable device is receiving power from the external system; and
responsive to determining that the at least one electrical contact on the wearable device is not receiving power from the external system and that the wearable device is mounted to the external system, providing an indication, by the controller using the output component, that the external system is inactive.

16. The method of claim 13, wherein the wearable device further comprises an output component, wherein the controller is operably coupled to the output component, and further comprising:
determining, by the controller, whether the wearable device is proximate to the external system based on the determined location and orientation of the at least one electrical contact on the wearable device relative to the at least one corresponding electrical contact on the external system;
determining, by the controller, whether the at least one electrical contact on the wearable device is receiving power from the external system; and
responsive to determining that the at least one electrical contact on the wearable device is not receiving power from the external system and that the wearable device is proximate to the external system, providing an indication, by the controller using the output component, that the wearable device is not receiving power from the external system.

17. The method of claim 16, wherein the wearable device further comprises an output component, wherein the controller is operably coupled to the output component, and further comprising:
determining, by the controller, an orientation of the wearable device relative to the external system based on the detected magnetic field;
determining, by the controller a change in the orientation of the wearable device relative to the external system such that the at least one electrical contact on the wearable device could receive power from the external system; and
providing, by the controller using the output component, an indication related to the determined change in the orientation of the wearable device relative to the external system.

18. The method of claim 13, wherein detecting, by the controller using the magnetometer, a magnetic field comprises detecting a magnitude and a direction of the magnetic field, and further comprising:
determining, by the controller, an identity of the external system based on the detected direction and magnitude of the magnetic field.

19. The method of claim 18, wherein determining the identity of the external system based on the detected direction and magnitude of the magnetic field comprises:
comparing, by the controller, the detected direction and magnitude of the magnetic field with a set of specified directions and magnitudes corresponding to a set of external system identities; and
selecting, by the controller, an identity from the set of external system identities based on the comparison between the detected direction and magnitude of the magnetic field and the set of specified directions and magnitudes.

20. The method of claim 13, wherein the wearable device further comprises a rechargeable battery, wherein the rechargeable battery is configured to power the wearable device, and further comprising:
recharging the rechargeable battery using power received from the external system via the at least one electrical contact on the wearable device.

* * * * *